(12) United States Patent
Tapie et al.

(10) Patent No.: US 8,611,371 B2
(45) Date of Patent: Dec. 17, 2013

(54) DEVICE FOR GENERATING COUNTER SIGNALS REPRESENTATIVE OF CLOCK SIGNALS AND DEVICE FOR RECONSTRUCTING CLOCK SIGNALS, FOR A PACKET-SWITCHED NETWORK

(75) Inventors: Thierry Tapie, Rennes (FR); Serge Defrance, Rennes (FR); Luis Montalvo, Domloup (FR)

(73) Assignee: Thomson Licensing, Issy-les-Moulineaux (FR)

( * ) Notice: Subject to any disclaimer, the term of this patent is extended or adjusted under 35 U.S.C. 154(b) by 365 days.

(21) Appl. No.: 12/012,694

(22) Filed: Feb. 5, 2008

(65) Prior Publication Data

US 2008/0187083 A1 Aug. 7, 2008

(30) Foreign Application Priority Data

Feb. 6, 2007 (FR) ..................................... 07 53082

(51) Int. Cl.
*H04J 3/06* (2006.01)
*H04L 27/06* (2006.01)
*H03D 3/24* (2006.01)

(52) U.S. Cl.
USPC ............ 370/464; 375/340; 375/373; 375/376

(58) Field of Classification Search
USPC .................................. 370/519, 518, 514, 506
See application file for complete search history.

(56) References Cited

U.S. PATENT DOCUMENTS

| | | | |
|---|---|---|---|
| 5,162,723 A * | 11/1992 | Marzalek et al. | .......... 324/76.19 |
| 5,699,392 A | 12/1997 | Dokic | |
| 7,020,791 B1 | 3/2006 | Aweya et al. | |
| 7,405,628 B2 * | 7/2008 | Hulfachor et al. | .............. 331/11 |
| 8,073,060 B2 | 12/2011 | Compton et al. | |
| 2004/0062278 A1 * | 4/2004 | Hadzic et al. | .................. 370/503 |

FOREIGN PATENT DOCUMENTS

| | | |
|---|---|---|
| EP | 0624982 A2 | 11/1994 |
| EP | 1303954 | 7/2008 |
| EP | 1129580 | 9/2008 |
| JP | 10022824 | 1/1998 |
| JP | 2001257664 | 9/2001 |
| JP | 2003018005 | 1/2003 |
| JP | 2003510912 | 3/2003 |
| JP | 2004505500 | 2/2004 |
| JP | 2004304809 | 10/2004 |

* cited by examiner

*Primary Examiner* — Yemane Mesfin
*Assistant Examiner* — Samina Choudhry
(74) *Attorney, Agent, or Firm* — Myers Wolin, LLC

(57) ABSTRACT

A device (D2) is dedicated to the reconstruction of clock signals, for example within communication equipment (EQ2) of an IP network. This device (D2) comprises i) a phase-locked loop (BY) having a cut-off frequency dependent, on the one hand, on a configuration value making it possible to reconstruct clock signals according to a chosen clock frequency, and on the other hand, a chosen sampling frequency, and ii) control means (MC2) responsible for forcing the phase-locked loop (BV) to present a variable cut-off frequency according to a received operating mode indication.

13 Claims, 4 Drawing Sheets

DEVICE FOR GENERATING COUNTER SIGNALS REPRESENTATIVE OF CLOCK SIGNALS AND DEVICE FOR RECONSTRUCTING CLOCK SIGNALS, FOR A PACKET-SWITCHED NETWORK

This application claims the benefit, under 35 U.S.C. §119 of French Patent Application 0753082, filed Feb. 6, 2007.

TECHNICAL BACKGROUND OF THE INVENTION

The invention relates to packet-switched communication networks and, more specifically, on the one hand, the generation of counter signals representative of clock signals intended for remote communication equipment, and on the other hand, for reconstructing clock signals within remote communication equipment, from counter signals transmitted via a packet-switched communication network.

The invention relates to all packet-switched communication networks, and in particular those with IP ("Internet Protocol") packet switching, whether wired (for example Ethernet (IEEE 802.3)) or wireless (for example IEEE 802.16 D-2004).

The term "communication equipment" should be understood here to mean any type of communication equipment forming part of, or able to be connected to, a (communication) network and requiring an internal clock, of master or slave type and the rate of which is set by a remote transmitter, in order to perform internal data processing operations. It can therefore be, for example, a base station (BTS or Node B), an access point, a fixed or mobile telephone, a fixed or portable computer, a personal digital assistant (PDA), a "smartphone" equipped with a communication card, a video recorder or a camera.

STATE OF THE ART

As those skilled in the art know, in some networks of the abovementioned type, certain items of communication equipment do not have a local clock of very high accuracy, such that they must be supplied (via the network) with so-called counter digital signals (or PCR signals), representative of very accurate clock signals, so that they can locally reconstruct these clock signals.

Such counter signals (PCR) are generated (on the transmit side) by a dedicated generating device, located in, or connected to, an item of communication equipment of the (packet-switched) network. Such a device generally comprises:
  clock means for delivering clock signals according to a so-called reference clock frequency, for example equal to 27 MHz,
  a counter for delivering a signal of periodic ramp which represents the number of clock signals that are delivered by the clock means, with a reset to zero according to this period, and
  a sampler for sampling the ramp signal at a chosen sampling frequency, for example corresponding to a sampling period equal to 5 ms, in order to deliver counter signals representative of the clock signals.

The sampling frequency (or period) is defined by what those skilled in the art generally call "sampling pulses" which are transmitted periodically (according to said sampling period) to all the communication equipment (or stations) of (or attached to) the network and which are the same for all such equipment. A sampling pulse defines a sampling instant. It can also, when it constitutes a frame pulse, as in the case of the IEEE 802.16-D standard, define for each item of equipment (or station) the moment when it can send or receive a frame. This type of sampling pulse is, for example (and not exclusively), defined by the IEEE 1588 standard initially dedicated to (wired) Ethernet networks and recently extended to wireless networks (of all types). It is used with a clock synchronization protocol called PTP (for "Precision Time Protocol"). It will be noted that the invention applies regardless of the type of sampling pulse used.

On the receive side, the (initial) clock signals are reconstructed by means of a dedicated reconstruction device, located in, or connected to, communication equipment connected to (or forming part of) the (packet-switched) network. Such a device comprises a phase-locked loop (PLL) normally comprising:
  comparison means (or comparator) for comparing a received (external) counter signal with a local counter signal and delivering a comparison signal (or error signal) representative of the result of this comparison,
  correction means (or corrector) for determining from the comparison signal (or error signal) a configuration value intended to enable clock signals to be reconstructed according to a chosen clock frequency,
  clock means for generating clock signals according to the clock frequency defined by the configuration value,
  a counter for delivering a signal of periodic ramp representative of the number of clock signals delivered by the clock means, and
  a sampler for sampling the ramp signal according to the chosen sampling frequency in order to deliver the local counter signal.

The counter signals (PCR), sampled on the transmit side at regular intervals (sampling period), arrive at irregular intervals on the receive side, mostly because of the jitter that is introduced by their transport (for example over IP). These PCR values are taken into account again at regular intervals locally. The PLL (on the receive side) filters the jitter, due to the sampling on the transmit side, of the ramp signal synchronous with a clock (having, for example, a frequency of 27 MHz) by a sampling pulse synchronous with a different frequency (for example equal to 80 MHz). There is therefore an error that is not constant. The phase-locked loop (PLL) is responsible for filtering this jitter, so that at the output of the counter (on the receive side), there is once again a ramp signal which evolves strictly synchronously with the ramp signal generated on the transmit side. The imprecision between the sampling instants on the transmit side and the receive side is absorbed by the PLL which has an appropriate bandwidth. Because of this, the rate of the clock signal reconstructed on the receive side is identical to that generated on the transmit side, both in frequency and in phase.

The phase-locked loop (PLL) is stable when the local counter signal (generated by the sampler and sometimes called PcrLoc) becomes identical to the received (external) counter signal (sometimes called Pcr_in) for each sampling period, and therefore when the comparison signal (or "error signal") delivered by the comparison means is equal to zero (0).

It can be shown that it takes approximately 2000 sampling periods to reach an established rate, or approximately 10 seconds when the sampling period is equal to 5 ms. This time needed to obtain an established rate is called PLL locking time. It is directly linked to the bandwidth of the PLL. Consequently, the more effectively the jitter associated with the error introduced by the sampling of the ramp signals (PCR counter signals) is to be filtered, the lower the cut-off frequency of the PLL needs to be. The accuracy in generating sampling pulses (over IP) is not high since it depends on exchanges of information over IP presenting a jitter introduced by the transport of IP packets.

SUMMARY OF THE INVENTION

Given the current architecture of the devices for reconstructing clock signals, it is not possible to reduce the locking time of the PLL if the PLL has a low cut-off frequency. The locking time of a PLL is in effect linked to its rise time, which itself depends on the cut-off frequency.

The aim of the invention is therefore to speed up the locking of the PLL in remote communication equipment connected to a packet-switched network, for example of IP type.

To this end, the invention firstly proposes a device, dedicated to the generation of counter signals representative of clock signals, and comprising i) clock means for delivering clock signals according to a so-called reference clock frequency, ii) a counter for delivering a signal of periodic ramp representative of the number of clock signals delivered by the clock means, and iii) a sampler for sampling the ramp signal according to a chosen sampling frequency in order to deliver counter signals.

This generation device is characterized by the fact that it comprises clock means for delivering clock signals according to at least one other clock frequency differing from the reference clock frequency, and that it comprises control means for selecting one of the deliverable clock frequencies according to a receive command (in order for the counter to be fed with clock signals having this selected clock frequency), and for defining (for the sampler) a sampling frequency equal to a reference sampling frequency multiplied by the value of the ratio between the selected clock frequency and the reference clock frequency.

The generation device according to the invention can include other characteristics which can be taken separately or in combination, and in particular:

- its clock means can be required to deliver clock signals according to at least one other clock frequency of which the ratio (K) with the reference clock frequency is equal to a chosen power of two ($K=2^n$);
- its clock means can comprise at least first and second clocks for delivering to outputs clock signals respectively having the reference clock frequency and the other clock frequency. In this case, it can comprise selection means comprising first and second inputs connected respectively to the outputs of the first and second clocks, and an output connected to the input of the counter and specifically for being connected, selectively and on command from the control means, either to the first input or to the second input in order to deliver clock signals having either the reference clock frequency or the other clock frequency;
- it can comprise network interface means connected to the output of the sampler and for forming data packets addressed to remote communication equipment and comprising the delivered counter signals and an indication signalling an operating mode defined by the selected clock frequency and sampling frequency defined by the control means;
  - the network interface means can be required to place in a packet to be transmitted a counter field, of which the most significant bit represents the operating mode indication and the other lower-order bits represent the last counter signal delivered by the sampler.

The invention also proposes first communication equipment, for a packet-switched communication network, specifically for transmitting packet frames, and equipped with a generation device of the type of that described hereinabove.

The invention also proposes a device, dedicated to the reconstruction of clock signals, and comprising a phase-locked loop (PLL) having a cut-off frequency dependent, on the one hand, on a configuration value making it possible to reconstruct clock signals according to a chosen clock frequency, and on the other hand, a chosen sampling frequency.

This device for reconstructing clock signals is characterized by the fact that it comprises control means for forcing the phase-locked loop (PLL) to present a variable cut-off frequency according to a received operating mode indication.

The device for reconstructing clock signals according to the invention can include other characteristics which can be taken separately or in combination, and in particular:

- its phase-locked loop (PLL) can comprise:
  - comparison means for comparing an external counter signal with a local counter signal and delivering a comparison signal representative of the result of this comparison,
  - correction means for determining the configuration value from the comparison signal,
  - clock means for delivering clock signals according to the clock frequency defined by the configuration value,
  - a counter for delivering a signal of periodic ramp representative of the number of clock signals delivered by the clock means, and
  - a sampler for sampling the ramp signal according to the chosen sampling frequency in order to deliver the local counter signal, and
- its control means can be required to configure the correction means so that they generate a configuration value forcing the clock means to deliver clock signals having a clock frequency equal to a reference clock frequency multiplied by a ratio value (K) dependent on a received operating mode indication, and for defining for the sampler a chosen sampling frequency, equal to a reference sampling frequency multiplied by this ratio value (K);
  - the ratio value (K) can, for example, be equal to the result of the division of the clock frequency defined by the configuration value (resulting from the configuration) by a reference clock frequency;
  - the ratio value (K) can, for example, be equal to a chosen power of two ($K=2^n$);
- it can comprise network interface means connected to the input of the phase-locked loop (PLL) and responsible for receiving frames of data packets comprising the external counter signals and the operating mode indication;
  - in the presence of received packets containing a counter field of which the most significant bit represents the operating mode indication and the other lower-order bits represent an external counter signal, the network interface means can be required to determine the value of the most significant bit in each received packet containing a counter field and transmit this value of the most significant bit to the control means.

The invention also proposes second communication equipment, for a packet-switched communication network, specifically for transmitting packet frames, and equipped with a device for reconstructing clock signals of the type of that described hereinabove.

BRIEF DESCRIPTION OF THE DRAWINGS

Other characteristics and advantages of the invention will become apparent from studying the detailed description below, and the appended drawings, in which.

The appended drawings can be used not only to complement the invention, but can also contribute to its definition, as appropriate.

DETAILED DESCRIPTION

The object of the invention is to make it possible to reduce the locking time of the phase-locked loop (PLL) of a device for reconstructing clock signals located in, or connected to, communication equipment connected to (or forming part of) a packet-switched communication network, implementing a mechanism for periodically transmitting one and the same sampling pulse defining, for all the items of communication equipment (or stations) attached to it, the moment when they can send or receive a packet frame.

Hereinafter, it is assumed by way of non-limiting example that the packet-switched communication network is a wired local area network (of Ethernet (802.3) type for example) offering IP access. However, the invention is not limited to this type of network. In practice it relates to any type of packet-switched communication network capable of transmitting by wired or wireless means frames of packets (possibly of IP type).

Moreover, it is assumed hereinafter, by way of non-limiting example, that the mechanism for periodically transmitting sampling pulses is that defined by the IEEE 1588 standard (initially dedicated to (wired) Ethernet networks and recently extended to wireless networks (of all types)) and which is used with the clock synchronization protocol called PTP (Precision Time Protocol). However, the invention is not limited to this type of sampling pulse. It applies in effect regardless of the type of sampling pulse used.

The invention relates not only to the (communication) equipment that needs to reconstruct very precise clock signals (generated by remote equipment), but also said remote equipment which generates the clock signals to be reconstructed.

The equipment affected by the invention includes, for example but not exclusively, those items of equipment that can be used to view video images filmed by a camera and that must be synchronized with each other (including with the camera), and in particular fixed or mobile telephones, fixed or portable computers, personal digital assistants (PDAs), video recorders and cameras.

Figure 1:
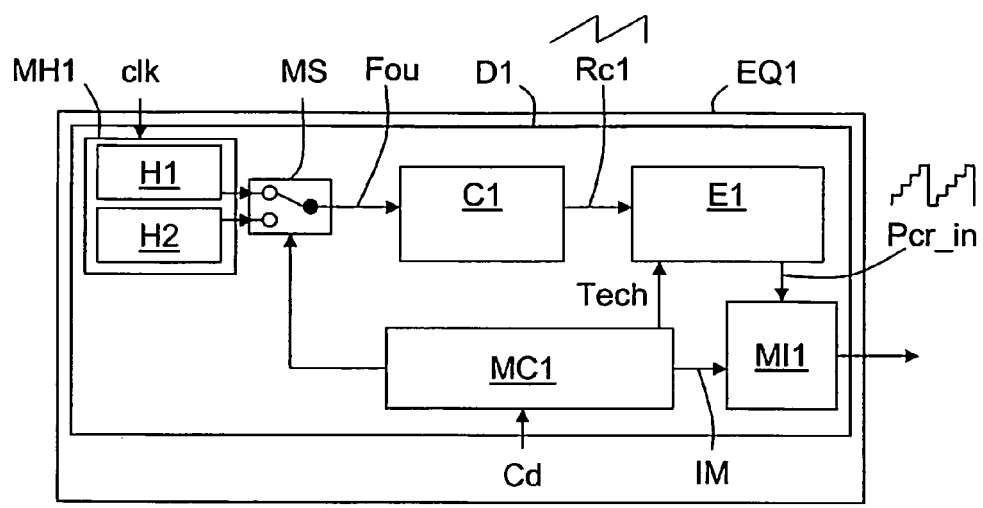
FIG. 1 very schematically and functionally illustrates exemplary communication equipment comprising an exemplary embodiment of a device for generating counter signals according to the invention, FIG. 2 very schematically and functionally illustrates exemplary communication equipment comprising an exemplary embodiment of a device for reconstructing clock signals according to the invention, FIG. 3 very schematically and functionally illustrates an exemplary embodiment of a correction module of a device for reconstructing clock signals according to the invention, FIG. 4 very schematically and functionally illustrates an exemplary embodiment of a clock module of a device for reconstructing clock signals according to the invention.

Reference is first of all made to FIG. 1 to describe (communication) equipment EQ1 dedicated to the generation of clock signals to be reconstructed. As illustrated, such equipment EQ1 comprises a device for generating counter signals D1 according to the invention. It will be noted that in a variant the device (for generating counter signals) D1 can be an element (such as, for example, an electronic card) external to the equipment EQ1 but coupled to the latter.

A device (for generating counter signals) D1 comprises at least one clock module MH1, one counter C1, one sampler E1 and one control module MC1.

The clock module MH1 comprises at least two clocks H1 and H2. The first clock H1 is for delivering clock signals according to a so-called reference clock frequency FH1. For example, the reference clock frequency FH1 is equal to 27 MHz. The second clock H2 is for delivering clock signals according to another clock frequency FH2 different from the reference clock frequency FH1. Preferably, the ratio K between this other clock frequency FH2 and the reference clock frequency FH1 is equal to a chosen power of two. For example, the other clock frequency FH2 is equal to 108 MHz (or a ratio K=FH1/FH2 equal to 4 ($2^2$)).

The first H1 and second H2 clocks are, for example, implemented in the form of oscillators (of the type of that illustrated in FIG. 4) that are perfectly synchronous with each other, and therefore constructing their clock signals from a common clock signal clk, having, for example, a frequency of 200 MHz.

The control module MC1 is in particular responsible for selecting one of the clock frequencies FH1, FH2, that the clock module MH1 can deliver, according to a received command Cd requesting an operation either in a so-called "normal" mode, or in a so-called "accelerated" mode. The normal mode corresponds to the normal use of clock signals having the reference clock frequency FH1 after a PLL locking phase. The accelerated mode corresponds to the use of clock signals having another clock frequency FH2 during a fast PLL locking phase. The command Cd can either originate from the network, or from a remote item of communication equipment which wants to rapidly lock its PLL in order to have clock signals according to the reference clock frequency FH1 as quickly as possible.

As illustrated in a non-limiting way in FIG. 1, the device D1 can include a selection module MS comprising as many inputs as there are clocks in the clock module MH1 and an output connected to the input of the counter C1. In the example illustrated, the selection module MS comprises first and second inputs connected respectively to the outputs of the first H1 and second H2 clocks. The output of the selection module MS can be connected selectively and on command from the control module MC1 (on receipt of a command), either to its first input or to its second input in order to deliver clock signals Fout having either the reference clock frequency FH1 or the other clock frequency FH2. Any type of selection module MS known to those skilled in the art can be envisaged, provided that it comprises n (n=2) signal inputs, a command input and an output that can be connected selectively to one of the n signal inputs.

The counter C1 is for generating and delivering to an output a ramp signal Rc1, periodic and representative at each instant of the number of clock signals Fout that have been delivered by the clock module MH1 since the last reset to zero. In other words, on each signal Fout (FH1 or FH2) received from the selection module MS, the value of the counter C1 is incremented by one unit. When this counter C1 value reaches a predefined maximum value, it is reset to zero and a new period begins.

The sampler E1 is for sampling the ramp signal Rc1 (delivered by the output of the counter C1) according to a sampling frequency Fech which is chosen by the control module MC1 according to the received command Cd, so as to form and deliver to an output counter signals Pcr_in.

More specifically, the control module MC1 defines a sampling frequency Fech which is equal to a reference sampling frequency multiplied by a multiplication factor K, the value of which is that of the ratio between the clock frequency Fout (FH1 or FH2) that it has selected and the reference clock frequency FH1, or K=Fout/FH1. The reference sampling frequency is precisely that which corresponds to the sampling period of the sampling pulses which are transmitted periodically by the network to all the equipment (or stations). For example, the reference sampling period is equal to 5 ms.

As illustrated, the counter signals Pcr_in, delivered by the sampler E1, are ramp signals sampled according to the sampling frequency Fech chosen by the control module MC1.

When the control module MC1 receives a command Cd requesting an operation in normal mode, it therefore selects the clock signal FH1 (=Fout) delivered by the first clock H1 (for example at 27 MHz) and defines a sampling frequency Fech which is equal to the reference sampling frequency (multiplication factor K equal to one (1) since the ratio Fout/FH1 (=FH1/FH1) is here equal to 1). When the control module MC1 receives a command Cd requesting an operation in accelerated mode, it selects the clock signal FH2 (=Fout) delivered by the second clock H2 (for example at 27 MHz) and defines a sampling frequency Fech which is equal to four times the reference sampling frequency (multiplication factor K equal to four (4) since the ratio Fout/FH1 (=FH2/FH1) is here equal to 4).

In other words, in the accelerated mode, the generation of the counter signal Pcr_in is accelerated on the transmit side (Tx) in the same ratio as the sampling frequency Fech (equal to Tech$^{-1}$). In the selected example, this amounts to dividing by four the reference sampling period, which gives 1.25 ms (5 ms/4), and to multiplying by four the reference clock frequency, which gives 108 MHz (27 MHz*4). Thus, the difference between two sampled counter values always remains equal to 135000 between two remote sampling pulses with a sampling period of 5 ms.

It will therefore be noted that, in the accelerated mode, the counter signals Pcr_in are sent to the receive part (Rx) according to a rate K times greater than that of the normal mode, K being the value of the ratio Fout/FH1. The device D1 remains in the accelerated mode until its control module MC1 receives a command Cd requesting the normal operating mode corresponding to a normal rate (here 27 MHz).

The counter signals Pcr_in are incorporated in packets (IP in this case) which are part of frames intended for transmission to remote equipment EQ2. This incorporation can, for example, be done by means of a network interface module MI1 that is preferably part of the device D1.

In order to notify the remote equipment EQ2 of the operating mode used on the device D1, the control module MC1 of the latter can, for example, order the network interface module MI1 to incorporate in a packet containing a counter signal Pcr_in an indication IM signalling the chosen operating mode (normal or accelerated) defined by the selected clock frequency Fout and the defined sampling frequency Fech.

For example, when the counter signal Pcr_in is transmitted in the counter field ("PCR field") of a packet, it is possible to use the most significant bit (MSB) to represent the operating mode indication IM and the other, lower-order bits to represent the last counter signal Pcr_in delivered by the sampler E1. By way of non-limiting example, when the most significant bit of the counter field is equal to one (1), this signals operation in accelerated mode, and when the most significant bit of the counter field is equal to zero (0), this signals operation in normal mode. The reverse situation is also possible. In these cases, the value proper of the counter signal Pcr_in is encoded on one bit less than in the state of the art, since the most significant bit of the counter field is now reserved for the operating mode indication IM.

It will be noted that it is also possible to encode on several bits the chosen acceleration ratio, so as to request an acceleration by 2, 4 or 8, for example, according to requirements. This can make it possible to offer a dynamic acceleration for certain applications.

The clocks H1 and H2, the PCR counter C1 and the sampler E1 are preferably implemented in the form of electronic circuits ("hardware"). However, it is possible to envisage at least one of them being implemented in the form of a combination of software modules ("software") and electronic circuits ("hardware").

The control module MC1 is preferably implemented in the form of software modules. However, it is possible to envisage it being implemented in the form of a combination of software modules and electronic circuits.

Moreover, the recovery of the PCR information and the mode change command (normal or accelerated mode) are decided by software.

Figure 2:
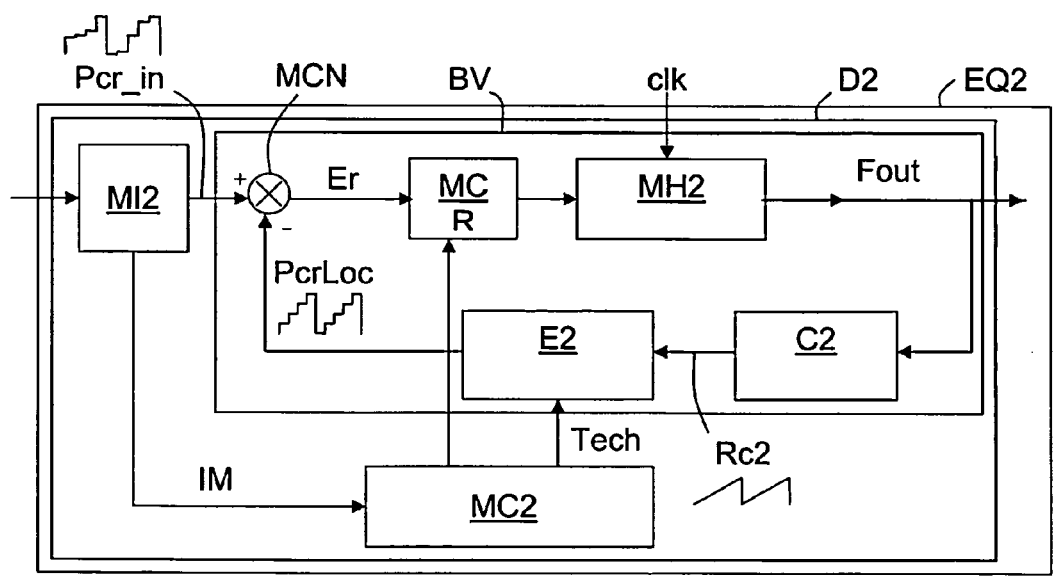

Reference is now made to FIGS. 2 to 8 to describe a device for reconstructing clock signals D2 according to the invention. As illustrated in FIG. 2, such a device D2 can be implemented in (communication) equipment EQ2 that needs very accurate clock signals. It will be noted that, in a variant, the device (for reconstructing clock signals) D2 can be an element (such as, for example, an electronic card) external to the equipment EQ2 but coupled to the latter.

A device (for reconstructing clock signals) D2 comprises at least one control module MC2 and one phase-locked loop (PLL) BV having a cut-off frequency Fc that is variable according, on the one hand, to a configuration value Addend which makes it possible to reconstruct the initial clock signals according to the chosen clock frequency Fout (defined by a device D1), and on the other hand, to a chosen sampling frequency.

The control module MC2 is in particular responsible for forcing the phase-locked loop BV to have a cut-off frequency Fc, the value of which depends on a received operating mode indication IM (for example defined by the most significant bit of the counter field also containing a counter signal Pcr_in). In other words, when the indication IM signals a normal operating mode, the control module MC2 forces the phase-locked loop BV to have a reference cut-off frequency, for example equal to 0.1 Hz, and when the indication IM signals an accelerated operating mode (locking phase of the PLL BV), the control module MC2 forces the phase-locked loop BV to have a cut-off frequency equal to K*0.1 Hz (for example K=4 if Fout=4*FH1). This indication IM is, for example, supplied to the control module MC2 by a network interface module MI2 which receives the packet frames (in this case IP) and analyses the content thereof. For example, the network interface module MI2 is responsible for determining the value of the most significant bit of the counter field that certain packets (IP) include. As illustrated in FIG. 2, the network interface module MI2 can be part of the reconstruction device D2. However, in a variant, it could be external to the reconstruction device D2 while being coupled to the latter.

As illustrated in FIG. 2, the phase-locked loop (PLL) BV has a conventional architecture. It therefore comprises a comparison module MCN, a correction module MCR, a clock module MH2, a counter C2 and a sampler E2.

The comparison module MCN is responsible for comparing the external counter signal Pcr_in (originating from a device D1) with a local counter signal PcrLoc, in order to deliver to an output a comparison signal Er which represents the result of this comparison. As illustrated in FIG. 2, the comparison module MCN can, for example, be implemented in the form of a comparator subtracting from the value of the external counter signal Pcr_in the value of the local counter signal PcrLoc, and delivering to its output a comparison signal (or error signal) Er equal to the result of this subtraction (Er=Pcr_in−PcrLoc).

It will be understood that, in the PLL BV, the comparison signal (or error signal) Er is equal to zero (0) at the end of the locking phase on input signals that have very little jitter. The decision to switch from one mode to the other must be derived from an algorithm. It is possible in effect to filter the error to observe it and use it to take a decision.

The correction module MCR is responsible for determining the configuration value Addend, which must be applied by the clock module MH2, from the comparison signal Er delivered by the comparison module MCN and a command obtained from the control module MC2 (dependent on the required operating mode).

More specifically, the control module MC2 is in particular responsible for configuring the correction module MCR by means of a command (dependent on the received indication IM) in order for it to generate a configuration value Addend (or Cout(n)) intended to force the clock module MH2 to deliver clock signals having a clock frequency Fout equal to the reference clock frequency FH1 multiplied by the multiplication factor K, the value of which is equal to that of the ratio Fout/FH1 defined by the received operating mode indication IM.

Figure 3:
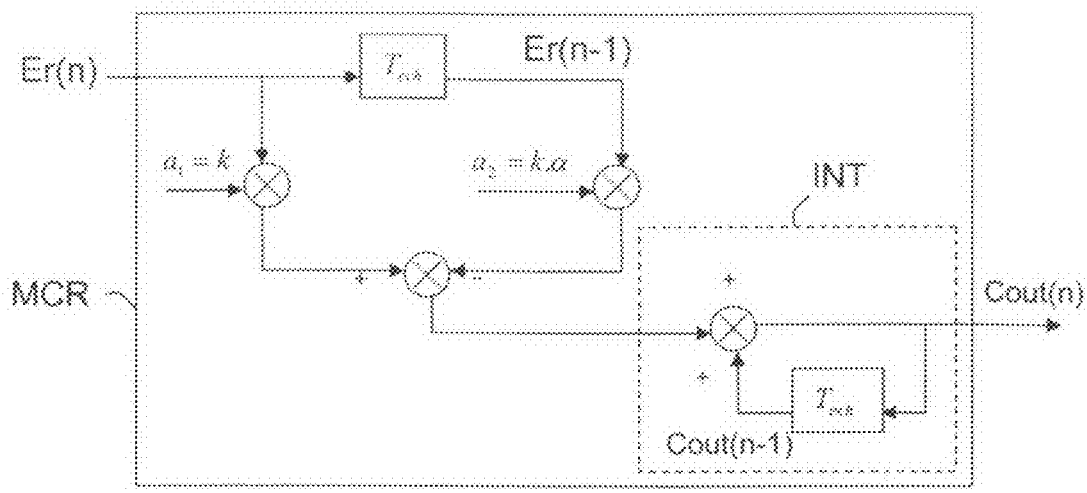

A non-limiting exemplary embodiment of the correction module MCR is diagrammatically illustrated in FIG. 3. The correction module MCR illustrated makes it possible to have a PLL BV, the impulse response of which is that of a second order. It implements a so-called Zdan method (but other methods known to those skilled in the art can be implemented). This type of correction module MCR makes it possible to have a zero speed error in the servo-control sense.

The references a1 and a2 of the correction module MCR denote factors, the values of which are chosen to obtain a chosen damping factor $\xi$. For example, a1=1250370 and a2=1247598. The reference INT denotes an integration module for determining the configuration value Cout(n) (or Addend) which must be used by the clock module MH2 for the sampling period Tech(n) concerned. This integration module INT guarantees a zero speed error. Er(n) denotes the comparison signal which has just been determined by the comparison module MCN for the current sampling period Tech(n). Er(n−1) denotes the comparison signal which was determined by the comparison module MCN in the preceding sampling period Tech(n−1). It will be noted that the control module MC2 does not need to provide the correction module MCR with the value Tech since the difference between two PCR signals is always equal to 135000, regardless of Tech.

The clock module MH2 is for delivering clock signals according to the clock frequency Fout which is defined by the configuration value Addend (Cout(n)) determined by the correction module MCR.

Figure 4:
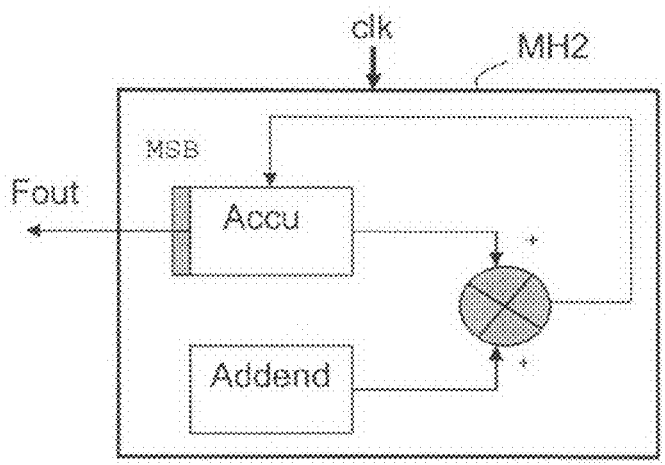

A non-limiting exemplary embodiment of the clock module MH2 is diagrammatically illustrated in FIG. 4. The digital clock module MH2 illustrated, of voltage-controlled oscillator (VCO) type, here implements a so-called accumulation principle based on the following relation:

$$\text{Addend} = \frac{Fout}{clk} \times 2^{p\_bit\_accu}$$

where clk is the operating frequency of the adder (for example equal to 200 MHz) and p_bit_accu is the width of the accumulator Accu (for example equal to 48 bits).

From the preceding relation, the clock frequency Fout is deduced:

$$Fout = \frac{\text{Addend} \times clk}{2^{p\_bit\_accu}}.$$

For example, if the configuration value Addend is equal to 0x228F5C28F5C2 and if the width p_bit_accu is equal to 48 bits, then the output frequency Fout is equal to 27 MHz and the gain A of the clock module MH2 (A=Fout/Addend=clk/$2^{p\_bit\_accu}$) is equal to $7.10543 \times 10^{-7}$.

It will be noted that the configuration value Addend is updated on each sampling period Tech.

The output of the clock module MH2 feeds the equipment EQ2 and a counter C2 with the reconstructed clock signal which has the clock frequency Fout.

The counter C2 is responsible for generating and delivering to an output a ramp signal Rc2, periodic and representative at each instant of the number of clock signals Fout that have been delivered by the clock module MH2 since the last reset to zero. In other words, on each clock signal Fout (FH1 or FH2) received from the clock module MH2, the value of the counter C2 is incremented by one unit. When this value of the counter C2 reaches a predefined maximum value (strictly identical to that of the counter C1 of the device D1), it is reset and a new period begins.

The sampler E2 is required to sample the ramp signal Rc2 (delivered by the output of the counter C2) according to the sampling frequency Fech which is chosen by the control module MC2 according to the received operating mode indication IM, so as to form and deliver to an output the local counter signals PcrLoc which are used by the comparison module MCN.

The control module MC2 is therefore also responsible for defining for the sampler E2 the sampling frequency Tech. The latter is equal to the reference sampling frequency (here equal to 5 ms, for example) multiplied by the multiplying factor K, the value of which is equal to that of the ratio Fout/FH1.

The assembly comprising the counter C2 and the sampler E2 makes it possible to maintain a counter value which changes at the current clock frequency Fout for a duration equal to the current sampling period Tech.

It can be shown that the assembly comprising the clock module MH2 and the counter C2 includes an integrator specifically for the servo-controls. This integrator guarantees a zero position error. The presence of this integrator in the PLL BV can be highlighted by the following reasoning.

Figure 5:
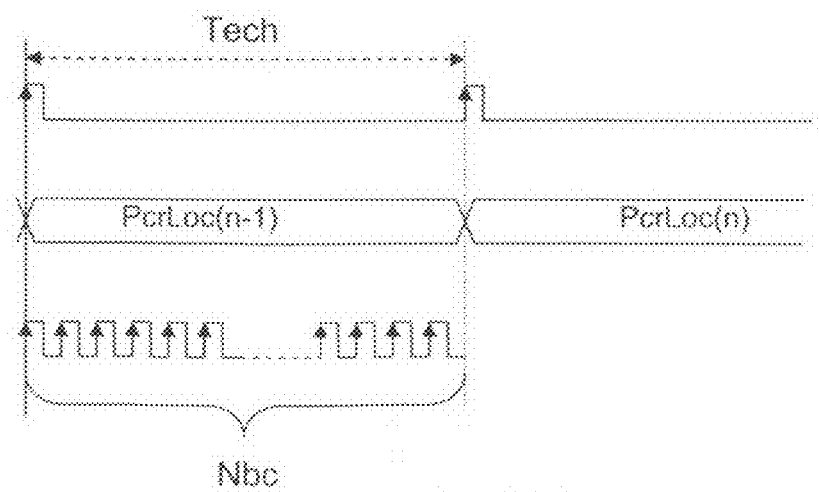
FIG. 5 illustrates exemplary timing diagrams of sampling signals Tech (top part), of local counter signals PcrLoc (middle part), and pacing signals Nbc (bottom part)

If reference is now made to the three timing diagrams illustrated in FIG. 5, it can be seen that the value of the local counter signal PcrLoc(n) corresponding to a sampling period Tech(n) depends on the value of the local counter signal PcrLoc(n−1) corresponding to the preceding sampling period Tech(n−1) and on the total number Nbc of clock pulses Fout of this same preceding sampling period Tech(n−1).

More specifically, there is the relation PcrLoc(n)=PcrLoc(n−1)+Nbc (during Tech(n−1)). Since Nbc(Tech(n−1)) is equal to Tech(n−1)*Fout, it is possible to rewrite PcrLoc(n) as follows, given the expression of Fout mentioned above:

$$PcrLoc(n) = PcrLoc(n-1) + \text{Addend}(n-1) \frac{clk}{2^{p\_bit\_accu}} \cdot T_{ech}.$$

This last Z transform relation can then be rewritten as indicated below, given the expression of the gain A of the clock module MH2 mentioned above:

$$PcrLoc - Z^{-1}PcrLoc = Z^{-1}\text{Addend} \cdot i \, A \cdot T_{ech}$$

From this last relation, the following relation is then deduced:

$$\frac{PcrLoc}{\text{Addend}} = \frac{Z^{-1}}{(1-Z^{-1})} \cdot AT_{ech}.$$

The term $[1/(1-Z^{-1})]$ constitutes the integrator mentioned above. It should be remembered that a digital integrator is, for example, an adder by means of which the input signal is added to the output signal delayed by a sampling period. Since the PLL loop BV comprises an integrator, there is no need to add one to it to obtain a zero position error in the servo-control sense.

To sum up, in the exemplary embodiment described above, when the control module MC2 receives an indication requesting the initiation of a locking phase for the PLL BV, it divides the sampling period Tech by the factor (or ratio) K (FH2/FH1) and multiplies the clock frequency Fout by this same factor K. For example, if the reference sampling period is divided by four (K=4) (changing, for example, from 5 ms to 1.25 ms), the reference clock frequency of the PLL BV is increased by a factor of four (changing, for example, from 27 MHz to 108 MHz). It is important to note that this avoids any discontinuity in the calculation of the internal values of the PLL BV, which amounts somewhat to temporarily accelerating the time for the duration of the locking phase.

The example given below illustrates this acceleration principle.

If a cut-off frequency Fc equal to 0.1 Hz is to be used in normal operating mode, with a reference sampling period Tech equal to 5 ms, a reference clock frequency Fout equal to 27 MHz, an accumulator width p_bit_accu of the clock module MH2 equal to 48 bits, an operating frequency of the adder of the clock module MH2 equal to 200 MHz, and a damping factor ξ equal to 0.707, then factors a1 and a2 respectively equal to 1250370 and 1247598 must, for example, be used in the correction module MCR so as to obtain a configuration value Addend equal to 0x228F5C28F5C2.

If a cut-off frequency Fc four (K=4) times greater than the preceding one (or 0.4 Hz) is to be used in an accelerated operating mode, with the same accumulator width p_bit_accu (48 bits), the same operating frequency of the adder of the clock module MH2 (200 MHz), and the same factors a1 and a2 (respectively 1250370 and 1247598), consequently corresponding to one and the same damping factor ξ (0.707), then a sampling period Tech four (K=4) times smaller than that of the reference (or 1.25 ms) and a configuration value Addend four (K=4) times greater than the preceding one (or 0x8A3D70A3D70A) must, for example, be used, so as to obtain a clock frequency Fout four (K=4) times greater than that of the reference (or 108 MHz).

The number N of sampling periods to reach the established rate being given by the same approximate relation in the normal mode and in the accelerated mode (N~ 2000*Tech), it can immediately be deduced therefrom that the locking time of the PLL BV in the accelerated mode is four (K=4) times faster than that in the normal mode, since the sampling period Tech in the accelerated mode is four (K=4) times smaller than that of the reference used in the normal mode.

It will be noted that, during the accelerated mode, the counter signals PcrLoc are generated on the basis of a clock frequency equal to 27*K MHz with a sampling period equal to 5 ms/K. The result of this is an increment between two sampling instants that is constant between the normal mode and the accelerated mode, namely 135000 (number of clock periods at 27 MHz every 5 ms or number of clock periods at 27*K MHz every 5 ms/K). Because of this, the value of the correction factors of the PLL BV remains constant. It is therefore not necessary to interpolate the intermediate values of the correction module MCR on changes of clock frequency Fout and of sampling period Tech.

It will also be noted that when K is equal to 4, the configuration value Addend can be changed either by a 2-bit left shift (multiplication by 4) of the values Cout(n) and Cout(n−1) contained in the integrator INT, when switching from the normal mode to the accelerated mode, or by a 2-bit right shift (division by 4) of the values Cout(n) and Cout(n−1) contained in the integrator INT, when switching from the accelerated mode to the normal mode. The instant at which the shift must be performed is given by the received sampling pulse.

Switching from one operating mode to another without acting on the configuration value Addend would involve the risk of restarting the PLL BV in a new locking phase.

It will, moreover, be noted that the device D2 remains in the accelerated mode (corresponding to an accelerated rate (here 108 MHz)) until its control module MC2 receives an indication IM designating the normal operating mode (corresponding to a normal rate (here 27 MHz)).

Figure 6:
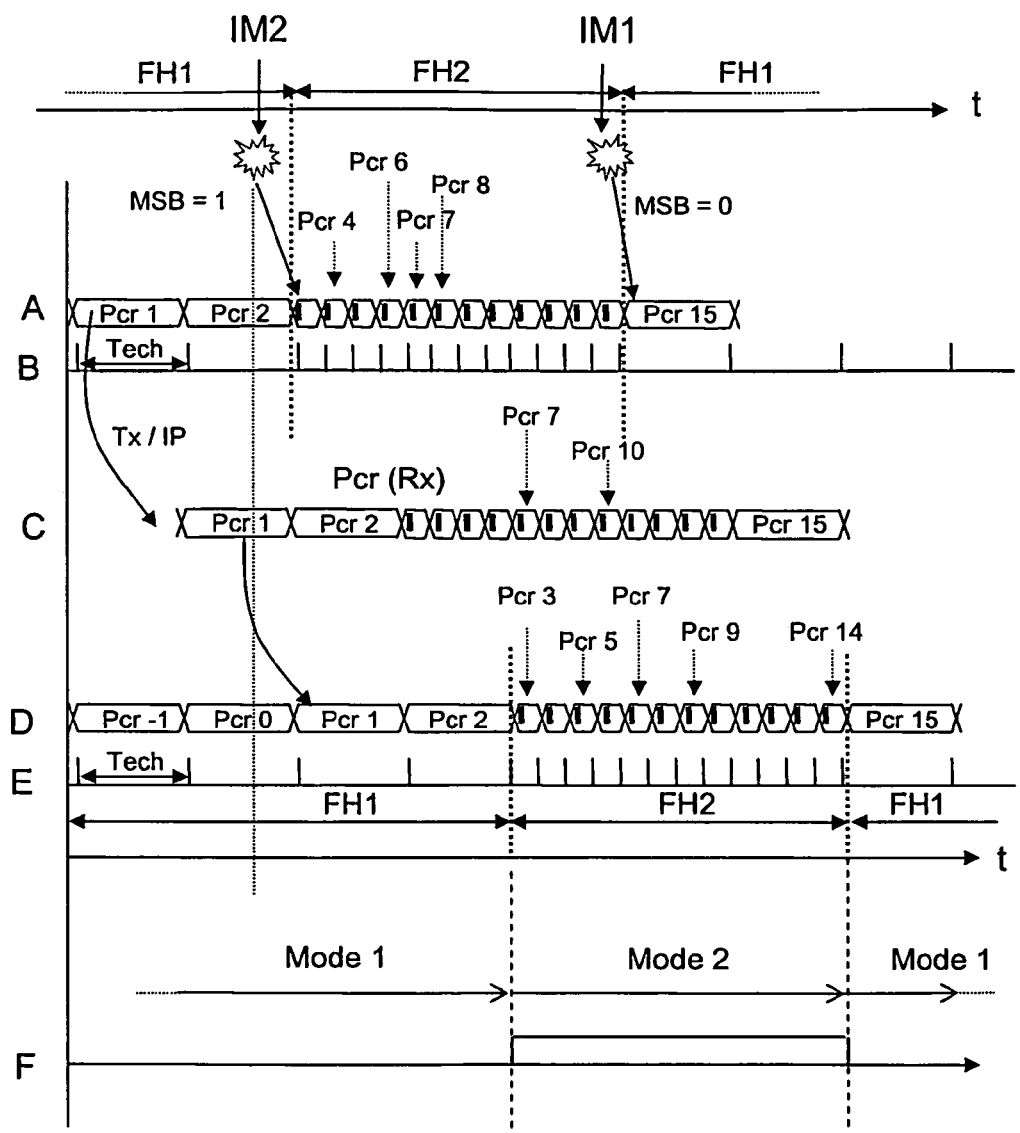
FIG. 6 illustrates timing diagrams of examples of changes of rate in transmission (Tx, A, B) and in reception (Rx, C-F)

FIG. 6 illustrates such changes of rate. More specifically, in FIG. 6:

the signal "A" corresponds to the counter signals Pcr_in generated on the transmit side (Tx, in the device D1), the signal "B" corresponds to the sampling signal (of sampling period Tech) on the transmit side (Tx, in the device D1), the signal "C" corresponds to the counter signals Pcr_in received on the receive side (Rx, in the device D2), the signal "D" corresponds to the counter signals Pcr_in received on the receive side (Rx, in the device D2) and taken into account again by the signal "E", the signal "E" corresponds to the sampling signal (of sampling period Tech) on the receive side (Rx, in the device D2), and the signal "F" corresponds to the command to divide by 4 (K=4) the values of the integrator INT of the correction module MCR.

It will be noted that, in FIG. 6, the counter signals Pcr_in are referenced "Pcr m" (in which m is a positive, negative or zero integer), the normal mode is referenced mode 1, the accelerated mode is referenced mode 2, IM2 denotes an indication requesting the switch to the accelerated mode (MSB=1) and IM1 denotes an indication requesting the switch to the normal mode (MSB=0).

In normal operation (clock signal at 27 MHz, for example), the PLL BV of the device D2 (receive side) is locked on the signal "D". There is a difference of n*Tech in the values of the counter signals Pcr_in between transmission (signal "A") and reception (signal "D" on which the PLL BV is locked). This is due to the transmission time which comprises the taking into account of the counter signal Pcr_in on the transmit side (D1), its transfer via the IP network and the taking into account of it on the receive side (D2). This difference is equal to an integer number of sampling periods Tech because the counter signal Pcr_in, on the transmit side as on the receive side, is taken into account on a sampling pulse. Since the transmission time is non-zero, n is at least equal to one. In the example illustrated in FIG. 6, n=2, which corresponds to an average case.

In accelerated operation with the clock signal at 108 MHz, for example, the PLL BV of the device D2 (receive side) is locked on the signal "D". There is still the same time difference in the values of the counter signals Pcr_in between transmission (signal "A") and reception (signal "D" on which the PLL BV is locked). However, the sampling period Tech has been divided by 4 (K=4 in the non-limiting example illustrated). However, the instant from which the transmit side and the receive side switch over to accelerated mode is not the same. This is due to the transmission time of the counter signal Pcr_in which also contains the switchover command (most significant bit, for example). Consequently, when switching over from the normal mode to the accelerated mode, the device D1 (in transmission) starts to transmit counter signals Pcr_in four (K=4) times faster than the device D2 (in reception) consumes them.

The excess counter signals Pcr_in are, for example, stored in a memory of FIFO (First In First Out) type of the device D2. It is the obligatory passage into this FIFO memory for the counter signals Pcr_in which explains why the time difference between the transmission of a counter signal Pcr_in and its recognition remains identical (whereas the sampling period Tech decreases). At the moment when the counter signal Pcr1 (signal "D") is taken into account, the counter signal Pcr2 (signal "C") is received, whereas at the moment when the counter signal Pcr3 (signal "D") is taken into account, the counter signal Pcr7 (signal "C") is already received. The FIFO memory, at this moment, contains the counter signals Pcr 4, Pcr 5 and Pcr 6.

This FIFO memory is emptied at the moment of the switchover from the accelerated mode to the normal mode.

Figure 7:
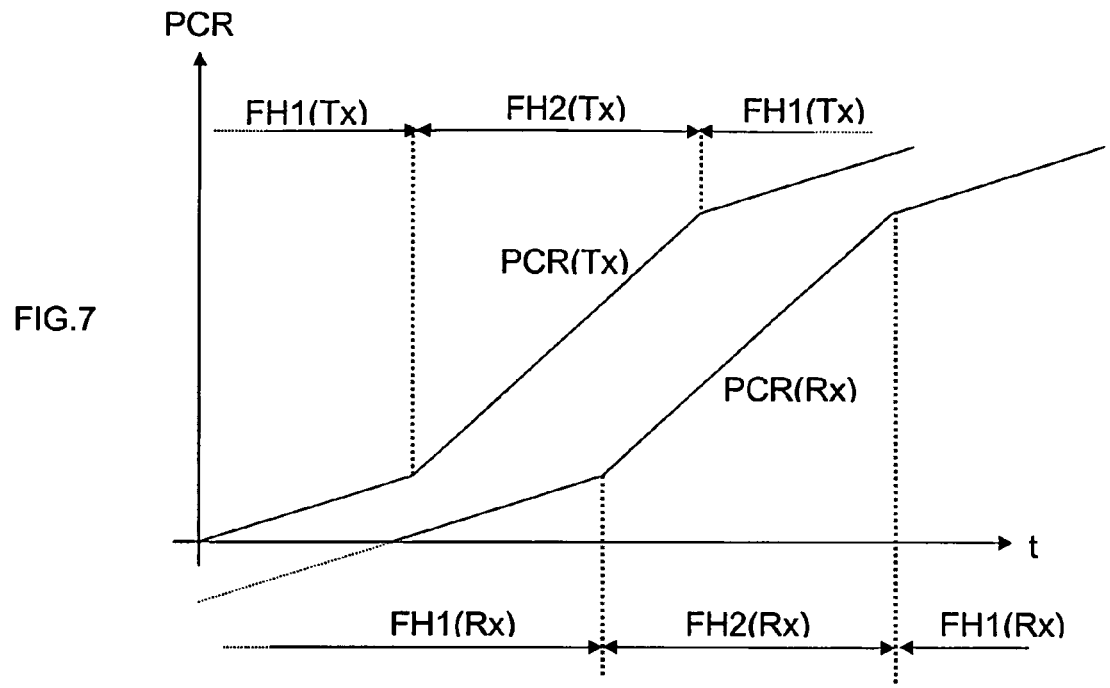
FIG. 7 illustrates exemplary time trend diagrams of the counter signal (PCR) in transmission (Tx) and in reception (Rx), when the clock frequency varies without implementing the accelerated mode according to the invention.

FIG. 7 shows the combined time trend curves of the values of the counter signals Pcr_in on the transmit side (Tx) and the receive side (Rx), in the absence of an acceleration phase. One is the image of the other with a constant time delay (equal in the abovementioned example to 2*Tech (n=2)).

As can be seen, a constant is added to the value of the counter signal Pcr_in on the receive side (Rx), so that the two curves are superimposed. It is this counter signal with the added constant that is used as the image of the sending timebase (clock signal on the transmit side Tx).

Figure 8:
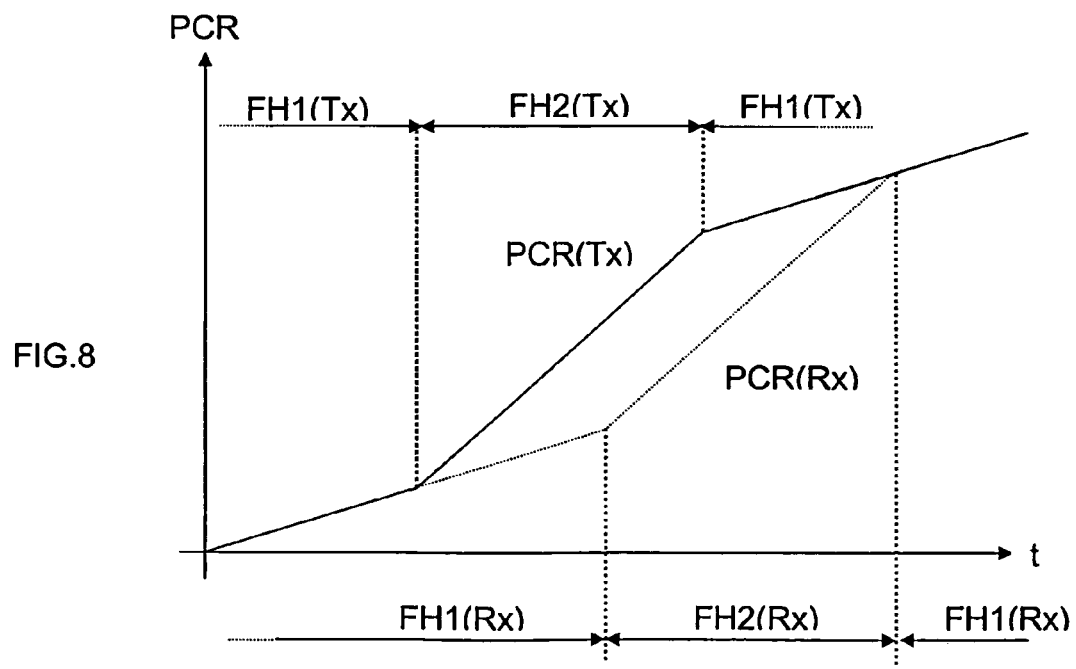
FIG. 8 illustrates exemplary time trend diagrams of the counter signal (PCR) in transmission (Tx) and in reception (Rx), when the accelerated mode according to the invention is implemented.

FIG. 8 represents the combined time trend curves of the values of the counter signals Pcr_in on the transmit side (Tx) and the receive side (Rx), in the presence of an acceleration phase. One is still the image of the other with a constant time delay (equal in the abovementioned example to 2*Tech (n=2)).

It can be seen that, during the time interval that runs from the instant when the transmission is switched from the normal mode to the accelerated mode to the instant when the reception is switched from the accelerated mode to the normal mode, the two curves are not superimposed. Consequently, during this time interval, the image of the sending timebase (clock signal on the transmit side Tx) is phase-shifted and the instants decoded with this image are too. Since this time interval corresponds to the locking phase, it does not constitute a problem given that what counts is that, outside the locking phase, the two PCR counters are indeed in phase, which is the case thanks to the invention.

The clock module (VCO) MH2, the PCR counter C2 and the sampler E2 are preferably implemented in the form of electronic circuits ("hardware").

The other elements forming the PLL BV and the control module MC2 are preferably implemented in the form of software modules. However, it is possible to envisage at least one of them being implemented in the form of a combination of software modules and electronic circuits.

The PCR values received in sample form are written into the PLL BV by software modules.

It will be noted that the invention can be implemented in a way that differs from the implementation described hereinabove with reference to FIGS. 1 to 8. In practice, in a variant, the cut-off frequency of the PLL BV can be increased during the locking phase by changing the value of the factors of the correction module directly. However, such a solution also requires all the intermediate values specific to the operation of the PLL BV to be changed directly, which necessitates value interpolations at the time of the change of frequency, and leads to complicated calculations.

The invention is not limited to the embodiments of a device for generating counter signals, a device for reconstructing clock signals, and communication equipment which has been described hereinabove purely by way of example; it encompasses all the variants that can be envisaged by those skilled in the art in the context of the claims below.

Thus, the preceding description has described one exemplary implementation of the invention in which there is a normal mode and a single accelerated mode. However, it is possible to envisage an implementation in which there is a normal mode and several different accelerated modes.

The invention claimed is:

1. Device for generating counter signals representative of clock signals, said device comprising:
   i) clock means arranged to deliver clock signals according to a so-called reference clock frequency,
   ii) a counter arranged to deliver a signal of periodic ramp representative of the number of clock signals delivered since the last reset to zero, and
   iii) a sampler arranged to sample said ramp signal at a chosen sampling frequency to form counter signals,
   wherein said clock means are arranged to deliver clock signals according to at least one other clock frequency differing from said reference clock frequency,
   wherein said device further comprises:
   control means arranged to select one of the deliverable clock frequencies according to a received command and to define a sampling frequency equal to a reference sampling frequency multiplied by the value of the ratio between the selected clock frequency and the reference clock frequency, and
   network interface means connected to the output of said sampler and arranged to form data packets addressed to remote communication equipment and comprising said delivered counter signals and an indication signaling an operating mode defined by the selected clock frequency and sampling frequency defined by said control means.

2. Device according to claim 1, wherein said clock means are arranged to deliver clock signals according to at least one other clock frequency, of which the ratio with said reference clock frequency is equal to a chosen power of two.

3. Device according to claim 1, wherein said clock means comprise at least first and second clocks arranged to deliver to outputs clock signals respectively having said reference clock frequency and said other clock frequency, wherein the device comprises selection means comprising first and second inputs connected respectively to the outputs of the first and second clocks, and an output connected to the input of said counter and specifically for being connected, selectively and on command from said control means, either to said first input or to said second input so as to deliver clock signals having either said reference clock frequency or said other clock frequency.

4. Device according to claim 2, wherein said clock means comprise at least first and second clocks arranged to deliver to outputs clock signals respectively having said reference clock frequency and said other clock frequency, wherein the device comprises selection means comprising first and second inputs connected respectively to the outputs of the first and second clocks, and an output connected to the input of said counter and specifically for being connected, selectively and on command from said control means, either to said first input or to said second input so as to deliver clock signals having either said reference clock frequency or said other clock frequency.

5. Device according to claim 1, wherein said network interface means are arranged to place, in a packet to be transmitted, a counter field, of which the most significant bit represents said operating mode indication and the other lower-order bits represent the last counter signal delivered by said sampler.

6. Communication equipment for a packet-switched communication network specifically for transmitting packet frames, wherein the communication equipment comprises a device for generating counter signals according to claim 1.

7. Device for reconstructing clock signals, comprising a phase-locked loop having a cut-off frequency dependent on i) a configuration value making it possible to reconstruct clock signals according to a chosen clock frequency, and ii) a chosen sampling frequency, said device comprising control means arranged to force said phase-locked loop to present a variable cut-off frequency according to a received operating mode indication, wherein said phase-locked loop (BV) comprises:
i) comparison means arranged to compare an external counter signal with a local counter signal and to deliver a comparison signal representative of the result of said comparison,
ii) correction means arranged to determine said configuration value from said comparison signal,
iii) clock means arranged to deliver clock signals according to the clock frequency defined by said configuration value,
iv) a counter arranged to deliver a signal of periodic ramp representative of the number of clock signals delivered by said clock means, and
v) a sampler arranged to sample said ramp signal according to the chosen sampling frequency to deliver said local counter signal,
wherein said control means are arranged to configure said correction means so that they generate a configuration value forcing said clock means to deliver clock signals having a clock frequency equal to a reference clock frequency multiplied by a ratio value dependent on a received operating mode indication, and to define for said sampler a chosen sampling frequency, equal to a reference sampling frequency multiplied by said ratio value.

8. Device according to in claim 7, wherein said ratio value is equal to the result of the division of the clock frequency defined by the configuration value resulting from the configuration by a reference clock frequency.

9. Device according to claim 7, wherein said ratio value is equal to a chosen power of two.

10. Device according to claim 8, wherein said ratio value is equal to a chosen power of two.

11. Device according to claim 7, wherein the device comprises network interface means connected to the input of said phase-locked loop and arranged to receive frames of data packets comprising said external counter signals and said operating mode indication.

12. Device according to claim 11, wherein, in the presence of received packets containing a counter field, of which the most significant bit represents said operating mode indication and the other lower-order bits represent an external counter signal, said network interface means are arranged to determine the value of the most significant bit in each received packet containing a counter field and to transmit this most significant bit value to said control means.

13. Communication equipment for a packet-switched communication network specifically for transmitting packet frames, wherein the communication equipment comprises a device for reconstructing clock signals according to claim 7.

* * * * *